(12) United States Patent  (10) Patent No.: US 8,130,212 B2
Umeda  (45) Date of Patent: Mar. 6, 2012

(54) CONTACT-SENSING DEVICE, MOBILE INFORMATION TERMINAL, AND CAPACITANCE CALIBRATION PROGRAM AND METHOD

(75) Inventor: Tetsuo Umeda, Kanagawa (JP)

(73) Assignee: Sony Ericsson Mobile Communications AB, Lund (SE)

( * ) Notice: Subject to any disclaimer, the term of this patent is extended or adjusted under 35 U.S.C. 154(b) by 429 days.

(21) Appl. No.: 12/407,372

(22) Filed: Mar. 19, 2009

(65) Prior Publication Data

US 2009/0267922 A1  Oct. 29, 2009

(30) Foreign Application Priority Data

Apr. 23, 2008  (JP) ................................. 2008-113187

(51) Int. Cl.
*G06F 3/044* (2006.01)
(52) U.S. Cl. ...................................................... 345/178
(58) Field of Classification Search .................... None
See application file for complete search history.

(56) References Cited

U.S. PATENT DOCUMENTS

| | | | | |
|---|---|---|---|---|
| 4,954,823 A | * | 9/1990 | Binstead | 341/26 |
| 7,834,856 B2 | * | 11/2010 | Grinshpoon et al. | 345/173 |
| 7,969,331 B2 | * | 6/2011 | Williams et al. | 341/33 |
| 2002/0196066 A1 | | 12/2002 | Krah et al. | |
| 2008/0047764 A1 | * | 2/2008 | Lee et al. | 178/18.06 |
| 2008/0158174 A1 | * | 7/2008 | Land et al. | 345/173 |
| 2010/0123677 A1 | * | 5/2010 | Brown et al. | 345/174 |

FOREIGN PATENT DOCUMENTS

JP  2005-512197  4/2005
JP  2007-329866 A  12/2007

* cited by examiner

*Primary Examiner* — Will J Klimowicz
*Assistant Examiner* — Mark Fischer
(74) *Attorney, Agent, or Firm* — Oblon, Spivak, McClelland, Maier & Neustadt, L.L.P.

(57) ABSTRACT

A contact-sensing device includes a capacitance contact-sensing unit including contact-sensing areas configured to at least detect contact with an external object; a calibration-value setting unit configured to set a calibration value to be used to calibrate capacitances of the contact-sensing areas based on capacitances of the contact-sensing areas excluding the contact-sensing area detected by the contact-sensing unit; a calibration determining unit configured to determine whether calibration of the capacitances of the contact-sensing areas is to be carried out based on capacitances of the contact-sensing areas excluding the contact-sensing area detected by the contact-sensing unit; and a capacitance calibrating unit configured to calibrate capacitances of all of the contact-sensing areas using the calibration value set by the calibration-value setting unit when the calibration determining unit determines that calibration is to be carried out.

9 Claims, 4 Drawing Sheets

CONTACT-SENSING DEVICE, MOBILE INFORMATION TERMINAL, AND CAPACITANCE CALIBRATION PROGRAM AND METHOD

BACKGROUND OF THE INVENTION

1. Field of the Invention

The present invention relates to a contact-sensing device including a capacitance detecting sensor as a user input device, a mobile information terminal including the contact-sensing device, and a capacitance calibration program and method.

2. Description of the Related Art

In recent years, many mobile devices having touch keys, such as mobile phones, have been commercialized. The touch keys installed in such mobile information terminals are often so-called capacitance touch sensors. Touch keys composed of capacitance touch sensors are capable of detecting a pushing action by a user by, for example, monitoring the change in capacitance when the user's finger comes into contact.

A capacitance touch sensor has a characteristic in that the capacitance varies greatly in response to a temperature change.

Causes of changing the temperature of a touch sensor may include an environmental change (temperature change) and a temperature increase in the terminal containing the touch sensor. A temperature change due to the environment occurs over a relatively long period of time. A temperature increase in the terminal, however, often occurs suddenly in a short period of time. A temperature increase in the terminal is caused by a temperature increase in the CPU and/or battery due to, for example, running a plurality of applications at the same time and/or use under high load, such as carrying out processing for an application for a long period of time.

A change in the capacitance of the touch sensor often occurs when the user slightly contacts a touch key other than the desired touch key with their finger. When a plurality of touch keys are provided in a limit space on a small casing, such as a mobile phone, each touch key is arranged adjacent to each other. Therefore, a capacitance change due to contacting an unexpected touch key easily occurs. When a finger is in contact with a touch sensor, the capacitance of the touch sensor changed due to the heat of the finger.

As described above, the capacitance of the touch keys having capacitance touch sensors easily varies due to a temperature change and/or unintentional contact.

For example, when a user long-pushes a desired touch key, their finger may unintentionally contact the adjacent touch key, causing the capacitance of the adjacent touch key to increase. In such a state, the long-push of the desired touch key causes application processing to be carried out for a long period of time and thus causes an increases in load. As a result, the terminal temperature increases, causing a change in the capacitance of each touch sensor. When this occurs, the adjacent touch key is highly likely to be mistakenly turned on.

A mobile phone according to the related art sets a time limit for a long-push of a desired touch key in order to prevent such malfunctions. In other words, when the long-push state exceeds the time limit, the mobile phone nullifies the touch keys once, and calibrates the touch keys. Calibration of the touch keys is carried out, for example, through a process of resetting the reference value of the capacitance.

As touch screen calibration system and method, Japanese Translation of PCT International Application, Publication No. 2005-512197 describes a touch screen calibration system including a touch screen having a plurality of terminals, a control circuit configured to apply at least one signal to the terminals and detects the effect of touching the touch screen on the signal, and a microprocessor configured to calculate mismeasurement by applying calibration impedance and acquiring a corrected touch position from a measured touch position by applying the mismeasurement in response to the touching.

SUMMARY OF THE INVENTION

For example, with the current models of mobile phones having a high-capacity memory for reproducing music, to retrieve a desired song from a large song list, the retrieval operation may take a long period of time, e.g., several tens of minutes. In other words, in such case, the user continues to push the touch keys for a long period of time.

However, as described above, since the mobile terminal according to the related art prevents malfunction by setting a time limit for a long-push of a touch key, a long-push for several tens of minutes is not possible. Of course, a long-push for several tens of minutes will be possible if the time limit for a long-push of a touch key is removed. In such a case, however, malfunction due to a temperature rise becomes highly likely, as described above.

Accordingly, the invention of a mobile phone having touch keys that allow a stably long-push operation without being affected by a temperature change is desired.

The present invention has been conceived in light of such situation. An object of the prevention is to provide a contact-sensing device that allows a stable long-push operation, a mobile information terminal including the contact-sensing device, and a capacitance calibration program and method.

The present invention provides a solution to the above-mentioned problem by providing a capacitance contact-sensing unit including a plurality of contact-sensing areas configured to at least detect contact with an external object; a calibration-value setting unit configured to set a calibration value to be used to calibrate capacitances of the contact-sensing areas on the basis of capacitance values of the contact-sensing areas excluding the contact-sensing area detected by the contact-sensing unit to be in contact with the external object; a calibration determining unit configured to determine whether or not calibration of the capacitances of the contact-sensing areas is to be carried out on the basis of capacitance values of the contact-sensing areas excluding the contact-sensing area detected by the contact-sensing unit to be in contact with the external object; and a capacitance calibrating unit configured to calibrate capacitances of all of the contact-sensing areas using the calibration value set by the calibration-value setting unit when the calibration determining unit determines that calibration is to be carried out.

According to an embodiment of the present invention, when the contacting of the external object is detected at any of the contact-sensing areas, the capacitance calibration value is set and whether or not capacitance calibration is to be carried out is determined on the basis of the capacitance values of the other contact-sensing areas. When calibration is to be carried out, the capacitances of all contact-sensing areas are calibrated. In other words, according to the embodiment of the present invention, calibration is carried out in real time while the contact of the external object is detected at any of the contact-sensing areas.

According to an embodiment of the present invention, when the contacting of the external object is detected at any of the contact-sensing areas, the capacitance calibration value is set and whether or not capacitance calibration is to be carried out is determined on the basis of the capacitance values of the other contact-sensing areas. When it is determined that calibration is to be carried out, the capacitances of all contact-sensing areas are calibrated using the calibration value. Therefore, according to an embodiment of the present invention, even when the capacitances change due to, for example, a temperature change, calibration that removes the effect of the temperature change is carried out. Consequently, a stable long-push operation is enabled without being affected by a temperature change.

DESCRIPTION OF THE PREFERRED EMBODIMENTS

An embodiment of the present invention will be described below with reference to the drawings.

In the embodiment described below, a mobile phone having capacitance touch keys is described as an embodiment of present invention. However, this is merely an example, and the present invention is not limited thereto.

[Outline of Internal Structure of Mobile Phone]

Figure 1:
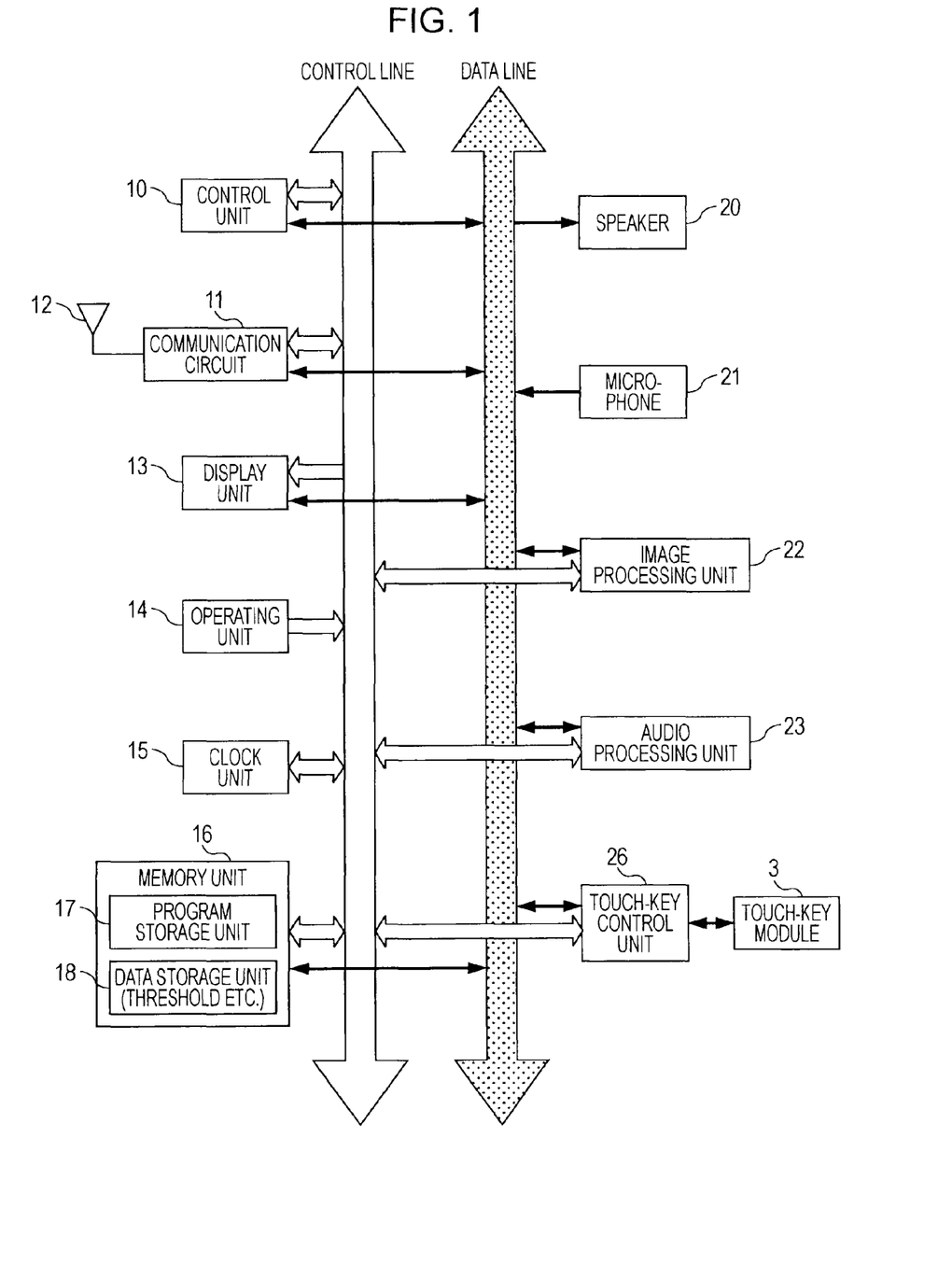
FIG. 1 is a block diagram illustrating, in outline, the internal structure of a mobile phone according to an embodiment of the present invention.

FIG. 1 illustrates, in outline, the internal structure of a mobile phone according to this embodiment.

As shown in FIG. 1, a communication antenna 12 and a communication circuit 11 transmit and receive signal radio waves for packet communication, such as conversation and electronic mail, and carry out frequency conversion, modulation, and demodulation of the transmitted and received signals.

A speaker 20 is a receiver speaker provided in the mobile phone or an audio output speaker that outputs a ringer (ringtone), an alarm sound, and/or recorded music. A microphone 21 is a microphone for transmission and collecting external sounds. An audio processing unit 23 carries out various types of processing associated with audio data, such as conversation audio data and recorded music.

An operating unit 14 includes operators provided on a casing (not shown) of the mobile phone, such as various keys including a numeric keypad, a talk key, an end-call/power key, arrow keys, a shutter button, and a jog dial, and an operating-signal generator that generates an operating signal when any of the operators is operated.

A display unit 13 includes a display device, such as a liquid crystal display or an organic light emitting display, and a display driving circuit for the display. An image processing unit 22 carries out various types of processing associated with displayed images, such as characters, symbols, still images, and moving images.

Various application programs, such as an operating system (OS) program, control programs for a control unit 10 to control various units, and a touch-key calibration program according to this embodiment, which is described below, and other various types of data are stored in a memory unit 16. Moreover, data is stored in the memory unit 16 as needed as a work area for the control unit 10. Various application programs, such as the touch-key calibration program according to this embodiment, are stored in a program storage unit 17 of the memory unit 16. Various types of data including thresholds used by the touch-key calibration program according to this embodiment, which is described below, is stored in a data storage unit 18. The programs including the touch-key calibration program according to this embodiment may be stored in the memory unit 16 in, for example, a disk recording medium or an external semiconductor memory or may be stored via a cable or a wireless connection of an external interface.

A clock unit 15 generates time information, such as date and time, and measures time. In this embodiment, the time information is also used for determining long-push and short-push operations of a touch key, as described below.

A touch-key module 3 includes a plurality of touch keys, each touch key having a contact detection area (touch sensor surface) that detects a change in capacitance. The plurality of contact detection areas in the touch-key module 3 each may be configured of an individual touch sensor surface or may be configured of one touch sensor surface divided into a plurality of contact detection sub-areas.

A touch-key control unit 26 controls the on/off state of the touch-key module 3, measures the capacitance of each touch key, and sends capacitance measurement data to the control unit 10. The touch-key control unit 26 calibrates the touch keys, as described below, under the control of the control unit 10.

The control unit 10 includes a central processing unit (CPU) and controls the various units of the mobile phone according to this embodiment and controls various types of signal processing. In particular, as described in detail below in this embodiment, the control unit 10 executes the touch-key calibration program stored in the program storage unit 17 of the memory unit 16 and carries out various types of data processing associated with the touch-key calibration program.

Moreover, although not shown in FIG. 1, the mobile phone according to this embodiment includes various components included in a typical mobile phone.

[Outline of External Structure of Mobile Phone]

Figure 2:
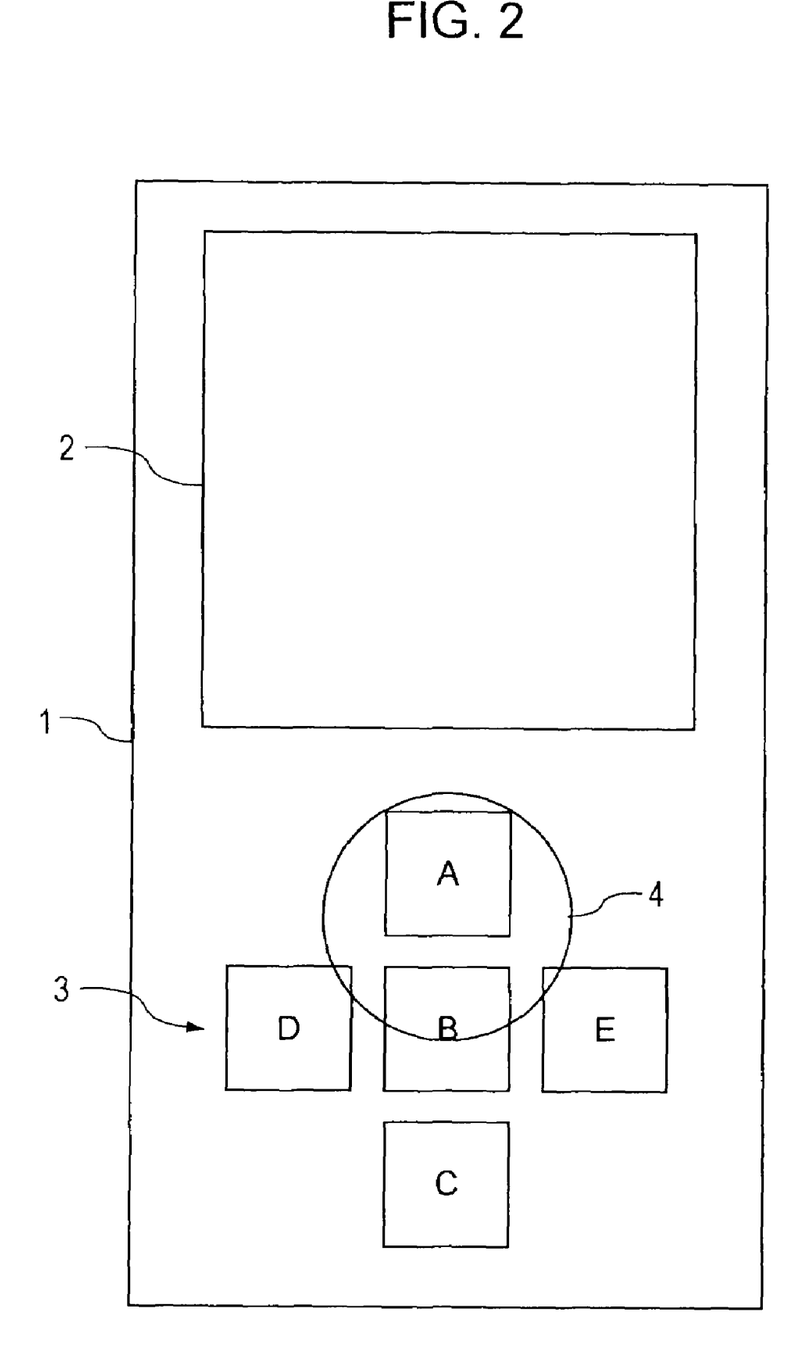
FIG. 2 is an external view illustrating, in outline, an external view of a mobile phone according to the embodiment of the present invention.

FIG. 2 illustrates, in outline, an external view of a mobile phone 1 according to this embodiment. FIG. 2 is an external front view of the folding-type mobile phone 1 in a folded state. The casing of the folded mobile phone 1 has a second display 2 and the touch-key module 3 including five touch keys A to E.

In the mobile phone 1 shown in FIG. 2, the five touch keys A to E are disposed adjacent to each other. For example, the touch key B is provided at the center, the touch key A is provided at the top, the touch key C is provided at the bottom, the touch key D is provided on the left, and the touch key E is provided on the right.

Since the touch keys A to E are disposed close to each other, for example, when the user touches the touch key A with a finger, it is highly likely that the user will touch not only the touch key A but also the touch keys B, D, and E. A circle 4 shown in the drawing represents the area where the user's finger is in contact. The finger contact area 4 includes not only the touch key A but also the touch keys B, D, and E.

As shown in FIG. 2, the capacitances of the touch key A and the other touch keys B, D, and E included in the finger contact area 4 increase. The capacitance of the touch key A intentionally contacted by the user's finger is stable even after the capacitance increases due to the finger coming into contact. On the other hand, the capacitances of the touch keys B, D, and E, which are unintentionally contacted by the user's finger, are unstable since the finger does not fully come in to contact with them.

[Thresholds of Touch Keys]

Figure 3:
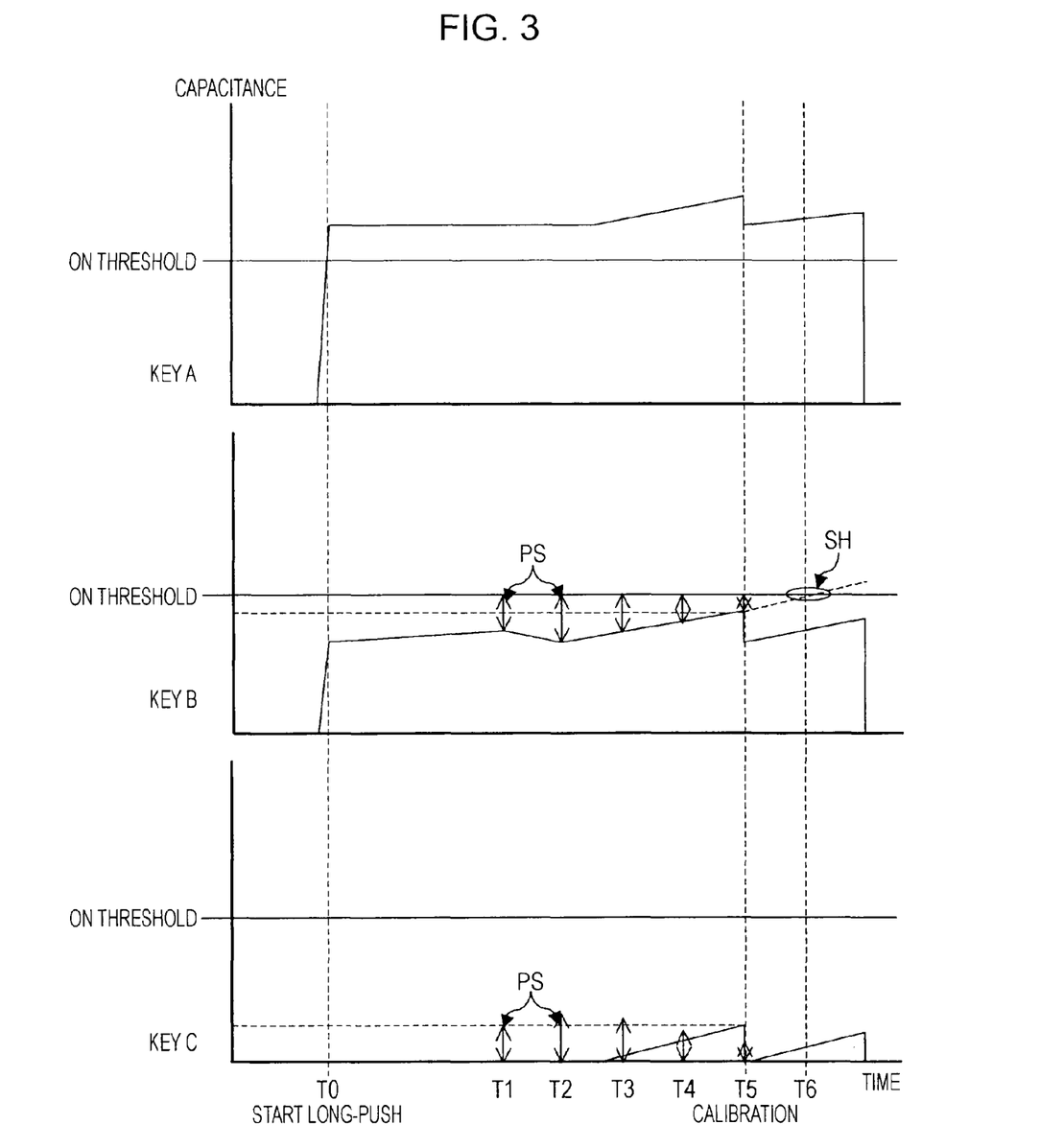
FIG. 3 illustrate graphs of an example of a capacitance change in a touch key A turned on by the user's push operation and an example of a capacitance change of other touch keys not pushed.

FIG. 3 illustrates graphs of capacitance changes in the touch keys A, B, and C, among the five touch keys A to E provided on the mobile phone 1. The top graph in FIG. 3 represents the capacitance change of the touch key A, which has a stable capacitance due to the user's finger being intentionally in contact. The middle graph in FIG. 3 represents the capacitance change of the touch key B at which capacitance increases the most among the touch keys B, D, and E, which are the touch keys unintentionally contacted by the user's finger. The bottom graph in FIG. 3 represents the capacitance change in the touch key C, which is not in the finger contact area 4, i.e., which is not in contact with the user's finger.

As shown in FIG. 3, an ON threshold is set to determine whether or not a push operation in which the user's finger intentionally touches a touch key, i.e., determining whether or not the touch key is turned on. Accordingly, when the capacitance of any of the touch keys exceeds the ON threshold, the corresponding touch key is turned on.

In the example shown in FIGS. 2 and 3, only the touch key A, which is intentionally pushed by the user, is turned on. The touch key B, which is unintentionally pushed by the user's finger, is not turned on because, although the capacitance increases, it does not exceed the ON threshold since the contact area is relatively small. For the touch key C, since the user's finger is not in contact, there is substantially no change in the capacitance, and thus the touch key C is not turned on.

Although not shown in FIG. 3, the touch keys have an OFF threshold for determining whether or not a touch key has switched from an ON state to an OFF state. The OFF threshold is a threshold for maintaining an ON state even when the capacitance of the touch key that is turned on by exceeding the ON threshold decreases slightly due to some reason (for example, a decrease in the contact area caused by the finger moving). The OFF threshold is normally set to approximately ¾ of the ON threshold (approximately 20° C. when converted into a temperature change in the environment).

[Flow of Touch Key Calibration Processing]

A flow of the calibration process of a touch key carried out by the mobile phone 1 according to this embodiment will be described with reference to the flow chart in FIG. 4 and the graphs in FIG. 3. The flow chart in FIG. 4 illustrates the process carried out by the control unit 10 of the mobile phone 1 according to this embodiment by executing the touch-key calibration program stored in the program storage unit 17 of the memory unit 16.

Figure 4:
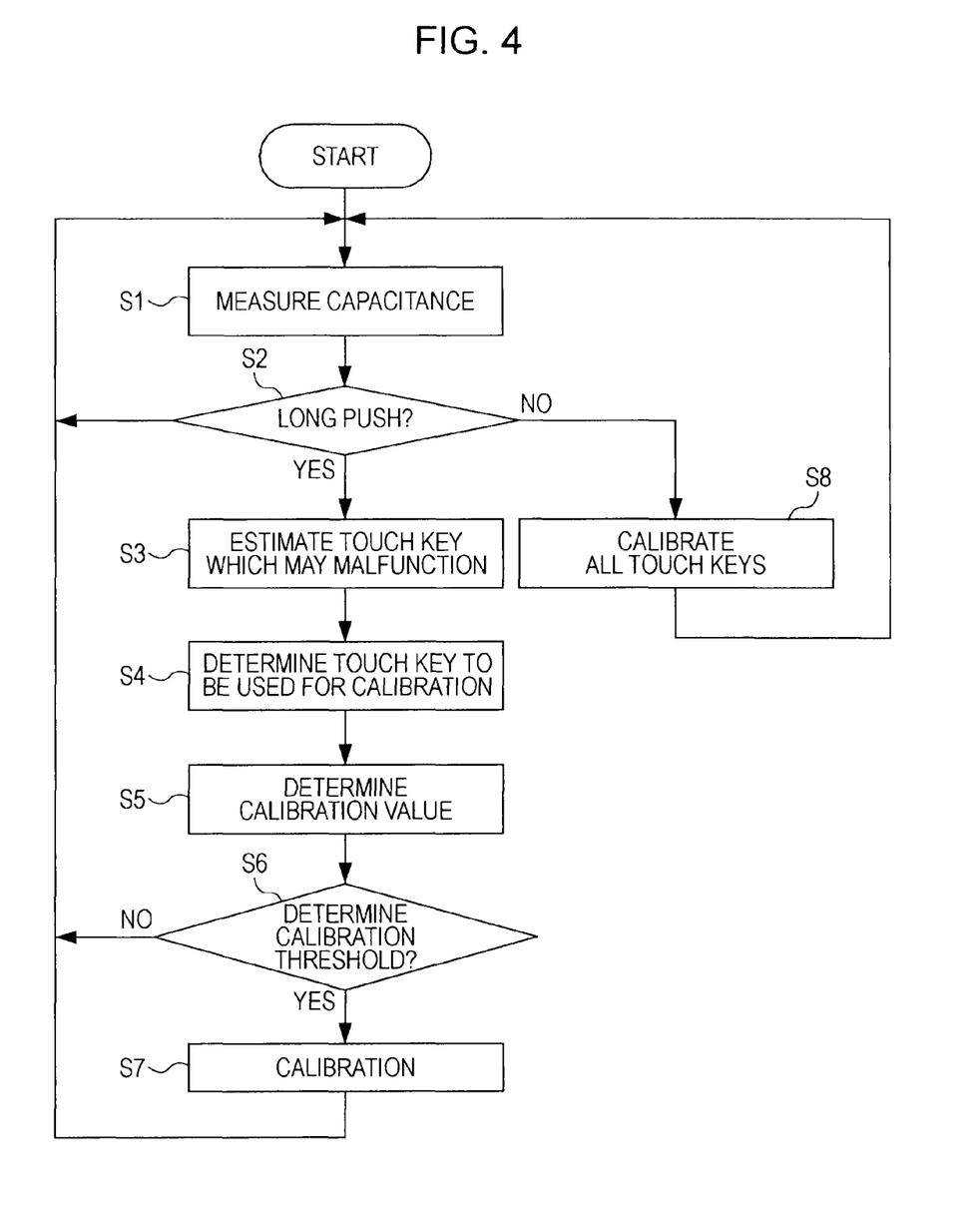
FIG. 4 is a flow chart illustrating the flow of a process carried out by the mobile phone according to this embodiment for calibration of the touch keys.

In FIG. 4, when the power of the touch-key module 3 is turned on by the touch-key control unit 26, the control unit 10 controls the touch-key control unit 26 to measure the current capacitances of the touch keys A to E and receives the measurement data in Step S1. Then, the control unit 10 monitors the measurement data. When the control unit 10 detects that the capacitance of any touch key has exceeded the ON threshold, as shown in FIG. 3, the process goes to Step S2. In FIG. 3, the capacitance of the touch key A, shown in FIG. 2, exceeds the ON threshold.

In Step S2, the control unit 10 determines whether or not the touch key A, which exceeds the ON threshold, is continued to be pushed by the user, i.e., whether or not the touch key A is being long-pushed. More specifically, when the ON threshold continues to be exceeded for more than a predetermined amount of time (for example, approximately 500 msec), the control unit 10 determines that the touch key A is being long-pushed and goes to Step S3. When the capacitance that has once exceeded the ON threshold decreases below the OFF threshold within a predetermined amount of time, the control unit 10 determines that a normal push operation (i.e., short-push) is performed and goes to Step S8. In FIG. 3, the touch key A, which is shown in FIG. 2, is determined to be long-pushed.

In Step S3, the control unit 10 determines the touch key that most likely will malfunction by monitoring the measurement data of the capacitances of the touch keys and sets a calibration threshold for determining whether or not to calibrate the capacitance. In other words, the control unit 10 first calculates the differences between the current capacitance values and the ON threshold for all touch keys except for those which exceed the ON threshold and which are turned on. Next, the control unit 10 determines the touch key having the smallest difference as a touch key that is most likely to malfunction. In other words, the control unit 10 determines the touch key that is most likely to exceed the ON threshold when, for example, the capacitance increases due to a temperature rise as the touch key that is most likely to malfunction. Then, the control unit 10 sets the difference between the current capacitance of the touch key that is most likely to malfunction and the ON threshold as a calibration threshold for determining whether or not to carry out capacitance calibration. In FIG. 3, the touch key B, which is shown in FIG. 2, is determined as the touch key that is most likely to malfunction. In FIG. 3, the difference indicated by arrows PS in the capacitance measurement graph for the touch key B is set as the calibration threshold acquired at each capacitance measurement timing. An example of a capacitance measurement timing is 25 msec.

Next, in Step S4, the control unit 10 determines the touch key to be used when generating the capacitance calibration value. In this case, the control unit 10 determines the touch key having the greatest difference between current capacitance below the ON threshold and the ON threshold as the touch key to be used when generating the calibration value. In other words, the control unit 10 determines the touch key that is least likely to exceed the ON threshold even when the capacitance increases due to, for example, a temperature rise, as the touch key to be used when generating the calibration value. In FIG. 3, the touch key C, shown in FIG. 2, is determined as the touch key to be used when generating the calibration value.

Then, in Step S5, the control unit 10 sets the current capacitance measurement value of the touch key C, which is determined to be used for generating the calibration value, as the calibration value.

Next, in Step S6, the control unit 10 determines whether or not calibration of the capacitances of all touch keys is to be carried out. In other words, the control unit 10 compares the calibration threshold (the difference indicated by arrows PS) acquired in Step S3 and the calibration value (capacitance of the touch key C) acquired in Step S5 and determines that calibration is not to be carried out when the calibration value does not exceed the calibration threshold. When the calibration value exceeds the calibration threshold, the control unit 10 determines that calibration is to be carried out. Then, the control unit 10 returns to Step S1 when it is determined that calibration is not to be carried out since the calibration value does not exceed the calibration threshold. The control unit 10 goes to Step S7 when it is determined that calibration is to be carried out since the calibration value exceeds the calibration threshold. In FIG. 3, the calibration values at capacitance measurement timings T1, T2, T3, and T4 do not exceed the calibration threshold, but the calibration value exceeds the calibration threshold at a capacitance measurement timing T5. Therefore, the control unit 10 determines that calibration is to be carried out at the capacitance measurement timing T5.

In Step S7, the control unit 10 calibrates all touch keys by subtracting the calibration value (capacitance of the touch key C) acquired in Step S5 from the capacitance of each of touch keys A to E. In other words, in FIG. 3, at the capacitance measurement timing T5, the capacitance values of all touch keys are each subtracted by the capacitance value of the touch key C. Through this process, the capacitance values of all touch keys are each reduced by the capacitance value of the touch key C.

In this way, the capacitance of the touch key B, which is most likely to malfunction, is reduced. Thus, malfunction can be prevented even when the capacitance of the touch key B reaches a capacitance SH, which is shown in FIG. 3, and exceeds the ON threshold.

The capacitance of the touch key A that is already turned on does not fall below the OFF threshold even when the capacitance is reduced through calibration. Therefore, the touch key A is not mistakenly turned off.

After the process in Step S7 is carried out, the control unit 10 returns to the process in Step S1. In this way, the calibration threshold and calibration value can be set and whether or not calibration is to be carried out can be determined repeatedly in real time after carrying out the calibration described above. Therefore, according to this embodiment, a long-push operation not affected by a temperature change is enabled.

Although not shown in the flow chart in FIG. 4, when the capacitance of the touch key A falls below the OFF threshold because, for example, the user's finger is detached, the process returns to Step S1.

In such a case, the capacitances of all touch keys measured in Step S1 decrease. Therefore, at this time, the control unit 10 determines that none of the touch keys are long-pushed in Step S2 and goes to Step S8.

In Step S8, the control unit 10 calibrates all touch keys. In other words, in such case, the capacitance of each touch key may not match the initial reference value due to a temperature change. Therefore, the control unit 10 calculates the average value of the capacitances of all touch keys, calibrates all touch keys on the basis of the average value, which is used as a new reference value, and then returns to Step S1.

SUMMARY

As described above, the mobile phone according to this embodiment does not use other devices, such as a temperature sensor, to calibrate, in real time, an increase in the capacitance of a touch key due to a temperature change. Therefore, the mobile phone according to this embodiment enables a stable long-push operation of a touch key.

The above-described embodiment of the present invention is merely an example. Thus, the present invention is not limited to the above-described embodiment and may be modified in various ways, depending on the design, within the scope of the present invention.

In the above, an example in which only one touch key with the smallest difference is described. However, when there is a plurality of touch keys having the smallest difference, the mobile phone according to this embodiment of the present invention may select one of these touch keys as the touch key most likely to malfunction.

Similarly, when there is a plurality of touch keys having the largest difference, the control unit of the mobile phone may select, for example, one of these touch keys as the touch key to be used for generating the calibration value. When there is a plurality of touch keys having the largest difference, the control unit of the mobile phone may select a touch key to be used to generate the calibration value, e.g., a touch key physically farthest from the touch key turned on.

In the above, an example in which the touch keys in the touch-key module 3 have substantially the same shape and substantially the same area is described. However, the shape and area of each touch key may differ. In particular, when there is a difference in the capacitance change of the touch keys due to a temperature change caused by the different shapes and areas of the touch keys, the control unit of the mobile phone may calculate a weighted calibration threshold and a weighted calibration value corresponding to the difference.

When two or more touch keys are substantially simultaneously pushed, the control unit of the mobile phone may ignore the push operation of these touch keys. Of course, in response to the substantially simultaneous push operation of two or more touch keys, the control unit of the mobile phone may turn on the two or more touch keys or may turn on whichever is pushed slightly faster.

In addition, an embodiment of the present invention is not limited and may be applied to various terminals, such as a personal digital assistant (PDA) having a touch key module, a personal computer, a mobile television game device, a mobile digital television receiver, or a car navigation device.

The present application contains subject matter related to that disclosed in Japanese Priority Patent Application JP 2008-113187 filed in the Japan Patent Office on Apr. 23, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A contact-sensing device, comprising:
    a capacitance contact-sensing unit including a plurality of contact-sensing areas configured to at least detect contact with an external object;
    a calibration-value setting unit configured to set a calibration value to be used to calibrate capacitances of the contact-sensing areas based on capacitance values of each of the contact-sensing areas excluding a contact-sensing area, of the plurality of contact-sensing areas, that has been detected by the capacitance contact-sensing unit to be in contact with the external object;
    a calibration determining unit configured to determine whether or not calibration of the capacitances of the contact-sensing areas is to be carried out based on capacitance values of the contact-sensing areas excluding the contact-sensing area that has been detected by the contact-sensing unit to be in contact with the external object; and
    a capacitance calibrating unit configured to calibrate capacitances of all of the contact-sensing areas using the calibration value set by the calibration-value setting unit when the calibration determining unit determines that calibration is to be carried out,
    wherein the capacitance contact-sensing unit detects whether or not a contact-sensing state continues for a predetermined amount of time in the contact-sensing area detected to be in contact with the external object; and
    the calibration-value setting unit sets the calibration value and the calibration determining unit determines whether or not calibration is to be carried out, when the capacitance contact-sensing unit detects that the contact-sensing state is continued for the predetermined amount of time.

2. The contact-sensing device according to claim 1, wherein
the contact-sensing unit compares a capacitance measurement value of each of the contact-sensing areas with a predetermined capacitance threshold and sets the contact-sensing area whose capacitance measurement value exceeds the predetermined capacitance threshold as the contact-sensing area that has been detected to be in contact with the external object,
the calibration-value setting unit sets a measurement value having a largest difference with the predetermined capacitance threshold among the capacitance measurement values of the contact-sensing areas excluding the contact-sensing area detected to be in contact with the external object as the calibration value,
the calibration determining unit sets the measurement value having the smallest difference with the predetermined threshold among the capacitance measurement values of the contact-sensing areas excluding the contact-sensing area detected to be in contact with the external object as a calibration threshold, and determines that calibration is to be carried out when the calibration value exceeds the calibration threshold as a result of comparing the calibration threshold to the calibration value, and
the capacitance calibrating unit carries out the calibration by subtracting the calibration value from each of the capacitances of all of the contact-sensing areas.

3. The contact-sensing device according to claim 1 or 2, wherein
the calibration-value setting unit sets the calibration value at a plurality of predetermined measurement times, and
the calibration determining unit determines whether or not calibration is to be carried out.

4. A mobile information terminal, comprising:
a capacitance contact-sensing unit including a plurality of contact-sensing areas configured to at least detect contact with an external object;
a terminal casing having the plurality of contact-sensing areas of the contact-sensing unit disposed on the outer surface;
a signal processing unit configured to process a signal corresponding to a contact-sensing area, of the plurality of contact-sensing areas, that has been detected by the contact-sensing unit to be in contact with the external object;
a calibration-value setting unit configured to set a calibration value used to calibrate capacitances of the contact-sensing areas based on capacitance values of the contact-sensing areas excluding the contact-sensing area detected by the contact-sensing unit to be in contact with the external object;
a calibration determining unit configured to determine whether or not calibration of the capacitances of the contact-sensing areas is to be carried out based on capacitance values of the contact-sensing areas excluding the contact-sensing area detected by the contact-sensing unit to be in contact with the external object; and
a capacitance calibrating unit configured to calibrate capacitances of all of the contact-sensing areas using the calibration value set by the calibration-value setting unit when the calibration determining unit determines that calibration is to be carried out,
wherein the capacitance contact-sensing unit detects whether or not a contact-sensing state continues for a predetermined amount of time in the contact-sensing area detected to be in contact with the external object; and
the calibration-value setting unit sets the calibration value and the calibration determining unit determines whether or not calibration is to be carried out, when the capacitance contact-sensing unit detects that the contact-sensing state is continued for the predetermined amount of time.

5. The mobile information terminal according to claim 4, wherein,
the contact-sensing unit compares a capacitance measurement value of each of the contact-sensing areas with a predetermined capacitance threshold and sets the contact-sensing area whose capacitance measurement value exceeds the predetermined capacitance threshold as the contact-sensing area that has been detected to be in contact with the external object,
the calibration-value setting unit sets a measurement value having a largest difference with the predetermined capacitance threshold among the capacitance measurement values of the contact-sensing areas excluding the contact-sensing area detected to be in contact with the external object as the calibration value,
the calibration determining unit sets the measurement value having the smallest difference with the predetermined threshold among the capacitance measurement values of the contact-sensing areas excluding the contact-sensing area detected to be in contact with the external object as a calibration threshold, and determines that calibration is to be carried out when the calibration value exceeds the calibration threshold as a result of comparing the calibration threshold to the calibration value, and
the capacitance calibrating unit carries out the calibration by subtracting the calibration value from each of the capacitances of all of the contact-sensing areas.

6. The mobile information terminal according to claim 4 or 5, wherein,
the calibration-value setting unit sets the calibration value at a plurality of predetermined measurement times, and
the calibration determining unit determines whether or not calibration is to be carried out.

7. A non-transitory computer-readable medium storing a capacitance calibration program, that when executed by a processor, causes the processor to perform the steps of:
setting, by a calibration-value setting unit, a calibration value to be used to calibrate capacitances of a plurality of contact-sensing areas based on capacitance values of the contact-sensing areas excluding a contact-sensing area, of the plurality of contact-sensing areas, that has been detected to be in contact with an external object by a capacitance contact-sensing sensor having the plurality of contact-sensing areas and configured to detect at least the contact of the external object;
determining, by a calibration determining unit, whether or not calibration of the capacitances of the contact-sensing areas is to be carried out based on capacitance values of the contact-sensing areas excluding the contact-sensing area that has been detected by the contact-sensing sensor to be in contact with the external object; and
calibrating capacitances of all of the contact-sensing areas using the calibration value set by the calibration-value setting unit when the calibration determining unit determines that calibration is to be carried out, wherein the contact-sensing sensor detects whether or not a contact-sensing state continues for a predetermined amount of time in the contact-sensing area detected to be in contact with the external object; and the calibration-value setting unit sets the calibration value and the calibration determining unit determines whether or not calibration is to be carried out, when the contact-sensing sensor detects that the contact-sensing state is continued for the predetermined amount of time.

8. A method of calibrating capacitance, comprising:

setting a calibration value to be used to calibrate capacitances of a plurality of contact-sensing areas by a calibration-value setting unit based on capacitance values of the contact-sensing areas excluding a contact-sensing area, of the plurality of contact-sensing areas, that has been detected by a contact-sensing sensor having the plurality of contact-sensing areas and configured to detect at least the contact with an external object;

determining, by a calibration determining unit, whether or not calibration of the capacitances of the contact-sensing areas is to be carried out based on capacitance values of the contact-sensing areas excluding the contact-sensing area that has been detected by the contact-sensing sensor to be in contact with the external object; and calibrating capacitances of all of the contact-sensing areas by a capacitance calibrating unit using the calibration value set by the calibration-value setting unit, when the calibration determining unit determines that calibration is to be carried out, wherein the contact-sensing sensor detects whether or not a contact-sensing state continues for a predetermined amount of time in the contact-sensing area detected to be in contact with the external object; and the calibration-value setting unit sets the calibration value and the calibration determining unit determines whether or not calibration is to be carried out, when the contact-sensing sensor detects that the contact-sensing state is continued for the predetermined amount of time.

9. A contact-sensing device, comprising:

a capacitance contact-sensing unit including a plurality of contact-sensing areas configured to at least detect contact with an external object;

a calibration-value setting unit configured to set a calibration value to be used to calibrate capacitances of the contact-sensing areas based on capacitance values of each of the contact-sensing areas excluding a contact-sensing area, of the plurality of contact-sensing areas, that has been detected by the capacitance contact-sensing unit to be in contact with the external object;

a calibration determining unit configured to determine whether or not calibration of the capacitances of the contact-sensing areas is to be carried out based on capacitance values of the contact-sensing areas excluding the contact-sensing area that has been detected by the contact-sensing unit to be in contact with the external object; and a capacitance calibrating unit configured to calibrate capacitances of all of the contact-sensing areas using the calibration value set by the calibration-value setting unit when the calibration determining unit determines that calibration is to be carried out, wherein the calibration-value setting unit sets a measurement value having a largest difference with a predetermined capacitance threshold among capacitance measurement values of the contact-sensing areas excluding the contact-sensing area detected to be in contact with the external object as the calibration value.

* * * * *